US012713657B2

(12) United States Patent
Suzumura et al.

(10) Patent No.: US 12,713,657 B2
(45) Date of Patent: Aug. 18, 2026

(54) THIN FILM TRANSISTOR USING OXIDE SEMICONDUCTOR, AND SEMICONDUCTOR DEVICE INCLUDING THE SAME

(71) Applicant: Magnolia White Corporation, Tokyo (JP)

(72) Inventors: Isao Suzumura, Tokyo (JP); Hajime Watakabe, Tokyo (JP); Akihiro Hanada, Tokyo (JP); Ryo Onodera, Tokyo (JP); Tomoyuki Ito, Tokyo (JP)

(73) Assignee: MAGNOLIA WHITE CORPORATION, Tokyo (JP)

( * ) Notice: Subject to any disclaimer, the term of this patent is extended or adjusted under 35 U.S.C. 154(b) by 690 days.

(21) Appl. No.: 17/724,512

(22) Filed: Apr. 20, 2022

(65) Prior Publication Data

US 2022/0246764 A1 Aug. 4, 2022

Related U.S. Application Data

(63) Continuation of application No. PCT/JP2020/035726, filed on Sep. 23, 2020.

(30) Foreign Application Priority Data

Nov. 26, 2019 (JP) ................................ 2019-213622

(51) Int. Cl.
*H10D 30/67* (2025.01)

(52) U.S. Cl.
CPC ..... *H10D 30/6755* (2025.01); *H10D 30/6713* (2025.01); *H10D 30/6757* (2025.01)

(58) Field of Classification Search
CPC ........... H01L 29/7869; H01L 29/78618; H01L 29/78693; H01L 27/1225; H01L 21/02565; G02F 1/1368; H10D 99/00
See application file for complete search history.

(56) References Cited

U.S. PATENT DOCUMENTS 9,859,391 B2 1/2018 Tanaka
2012/0319113 A1* 12/2012 Yamazaki ........... H01L 29/7869 257/66

(Continued)

FOREIGN PATENT DOCUMENTS

JP 2016-184635 A 10/2016
JP 2017-85079 A 5/2017
WO 2019082465 A1 5/2019

OTHER PUBLICATIONS

International Search Report and Written Opinion mailed on Dec. 8, 2020, received for PCT Application PCT/JP2020/035726, Filed on Sep. 23, 2020, 8 pages including English Translation.

(Continued)

*Primary Examiner* — Jessica S Manno
*Assistant Examiner* — Ricky Verdes
(74) *Attorney, Agent, or Firm* — XSENSUS LLP

(57) ABSTRACT

The present invention addresses the problem of: realizing a TFT that uses an oxide semiconductor and that is capable of maintaining stable characteristics even in the case where the TFT is miniaturized; and realizing a display device that has high-definition pixels using such a TFT. To solve this problem, the present invention has the following configuration. A semiconductor device including an oxide semiconductor TFT formed using an oxide semiconductor film 109, the semiconductor device being characterized in that: the channel length of the oxide semiconductor TFT is 1.3 to 2.3 μm; and the sheet resistance of a source region 1092 and a drain region 1091 of the oxide semiconductor film 109 is 1.4 to 20 KΩ/□.

8 Claims, 21 Drawing Sheets

(56) References Cited

U.S. PATENT DOCUMENTS

| | | | |
|---|---|---|---|
| 2016/0343866 | A1* | 11/2016 | Koezuka ........... H01L 29/78696 |
| 2020/0251505 | A1 | 8/2020 | Watakabe et al. |

OTHER PUBLICATIONS

Japanese Office Action issued Dec. 12, 2023, in corresponding Japanese Patent Application No. 2019-213622, 6 pages.

* cited by examiner

FIG. 19

| Hydrogen content of interlayer insulating film (SiN film) | Low | | Optimized high | |
|---|---|---|---|---|
| Doze amount (B) by ion implantation (I/I) | Low | High | Low | High |
| Field effect mobility ($\mu$FE) | 0.44cm$^2$/Vs | 7.3cm$^2$/Vs | 2.0cm$^2$/Vs | 11.2cm$^2$/Vs |
| Threshold voltage ($V_{th}$) | 17V | 2.2V | 1.9V | 4V |
| Sheet resistance in source / drain region | ~13000kΩ/□ | 2.2kΩ/□ | 3.8kΩ/□ | 1.4kΩ/□ |

W/L of TFT = 3/2 $\mu$m

| $\mu_{FE}$ | 9.5cm$^2$/Vs |
|---|---|
| $V_{th}$@$I_{ds}$=1nA | 0.44V |
| $\sigma V_{th}$ | 0.26V |

Stress conditions
Voltage: $V_{gs}$=−13.3V, $V_d$=0V, $V_s$=0V
Temperature: 60°C
Stress time: 3600s
Illumination: 8000cd/m²
from the bottom of the TFT

THIN FILM TRANSISTOR USING OXIDE SEMICONDUCTOR, AND SEMICONDUCTOR DEVICE INCLUDING THE SAME

CROSS-REFERENCE TO RELATED APPLICATIONS

The present application is a continuation application of International Application No. PCT/JP2020/035726, filed on Sep. 23, 2020, which claims priority to Japanese Patent Application No. 2019-213622, filed on Nov. 26, 2019. The contents of these applications are incorporated herein by reference in their entirety.

BACKGROUND OF THE INVENTION

(1) Field of the Invention

The present invention relates to a thin film transistor using an oxide semiconductor, a display device and a semiconductor device using the same.

(2) Description of the Related Art

A TFT (thin film transistor, Thin Film Transistor) including an oxide semiconductor has a smaller leakage current than a TFT using polysilicon, and has a larger mobility than a TFT using a-Si (amorphous silicon). Therefore, it is suitable as a switching element in a pixel of a display device or a sensor element of a sensor device. Further, since a TFT including an oxide semiconductor can be formed at a lower temperature than a TFT including polysilicon or the like, a semiconductor device using a resin substrate can be realized.

On the other hand, the oxide semiconductor has a problem in that it tends to change with time due to entry of hydrogen or oxygen. Reference 1 discloses, to surround an oxide semiconductor by an insulating film having a property of blocking hydrogen or oxygen to suppress a change in characteristics of the oxide semiconductor in a TFT including an oxide semiconductor.

Reference 2 discloses to diffuse hydrogen of a drain or source to form a region having the same action as an LDD region in a polysilicon TFT between a channel and a drain, i.e. a region having lower resistance than that of a channel but higher resistance than that of a drain or a source.

PRIOR ART REFERENCE

Patent Document

[Patent document 1] Japanese Patent Application Publication No. 2016-184635 A

[Patent document 2] Japanese Patent Application Publication No. 2017-85079 A

SUMMARY OF THE INVENTION

Hereinafter, a liquid crystal display device will be described as an example, but a similar problem is common to a display device such as an organic EL display device including a thin film transistor having an oxide semiconductor, a sensor device, and a semiconductor device including a thin film transistor having an oxide semiconductor. A semiconductor device is an apparatus including a plurality of transistors formed on a substrate. A semiconductor device includes a display device, a sensor device, and a TFT substrate provided with a plurality of thin film transistors described later.

In a liquid crystal display device, a TFT substrate having pixel electrodes, which have thin film transistors (TFT), and the like, formed in a matrix form, and a counter substrate opposed to the TFT substrate are arranged, and liquid crystal is sandwiched between the TFT substrate and the counter substrate. Then, an image is formed by controlling the transmittance of light by the liquid crystal molecules for each pixel.

A TFT used as a switching in a pixel requires a small leakage current, while a large ON current is required. In other words, in the TFT, it is required that the resistance is sufficiently small in the source region and the drain region, while a sufficiently large resistance is maintained in the channel region when the TFT is turned off.

In an oxide semiconductor, high resistance can be maintained by supplying sufficient oxygen to a channel region. On the other hand, hydrogen is supplied from a silicon nitride film (SiN) or the like to the source region and the drain region, whereby the oxide semiconductor can be reduced and the resistance can be reduced.

As a method of decreasing the resistance of the oxide semiconductor by reducing the source and drain regions, there is a technique of diffusing hydrogen into the source and drain regions by exposing the source and drain regions to plasma containing a large amount of hydrogen, in addition to a technique of laminating SiN or the like on the source and drain regions.

On the other hand, as a screen of a display device becomes highly precise, a pixel becomes smaller, and thus, a TFT needs to be miniaturized. However, when the channel length is reduced in the TFT, hydrogen existing in the source and drain diffuses into the channel region, causing a change in characteristics of the TFT, or a risk of conducting (depletion) of the TFT.

An object of the present invention is to provide a TFT which can maintain stable characteristics even when a TFT is miniaturized in a TFT using an oxide semiconductor; and thus, it is an object of the present invention to realize a semiconductor device such as a liquid crystal display device having a high-definition screen, a display device such as an organic EL display device, and a sensor device having high resolution.

The present invention overcomes the above problems, and a specific means is as follows.

(1) A thin film transistor including: an oxide semiconductor, a gate electrode, and a gate insulating film formed between the oxide semiconductor and the gate electrode, in which the oxide semiconductor has a channel region corresponding to the gate electrode, and a source region and a drain region adjacent to the channel region, a channel length of the channel region is 1.3 to 2.3 μm, a sheet resistance of the drain region and the source region is 1.4 KΩ/□ to 20 KΩ/□ (hereinafter KΩ/□).

(2) The semiconductor device according to (1), in which the sheet resistance of the drain region and the source region of the oxide semiconductor is 3 KΩ/□ to 10 KΩ/□.

BRIEF DESCRIPTION OF THE DRAWINGS

FIG. 19 is a table which shows a relation between characteristics of the TFT and a process to form the oxide semiconductor TFT;

FIG. 23 is a cross sectional view of a display area of an organic EL display device;

DETAILED DESCRIPTION OF THE PREFERRED EMBODIMENTS

Examples of the oxide semiconductor include IGZO (Indium Gallium Zinc Oxide), ITZO (Indium Tin Zinc Oxide), ZnON (Zinc Oxide Nitride), and IGO (Indium Gallium Oxide). An oxide semiconductor which is optically transparent and not crystalline is called TAOS (Transparent Amorphous Oxide Semiconductor). Hereinafter, in this specification, the oxide semiconductor may be collectively referred to as TAOS. Hereinafter, the present invention will be described in detail by following embodiments.

Embodiment 1

Figure 1:
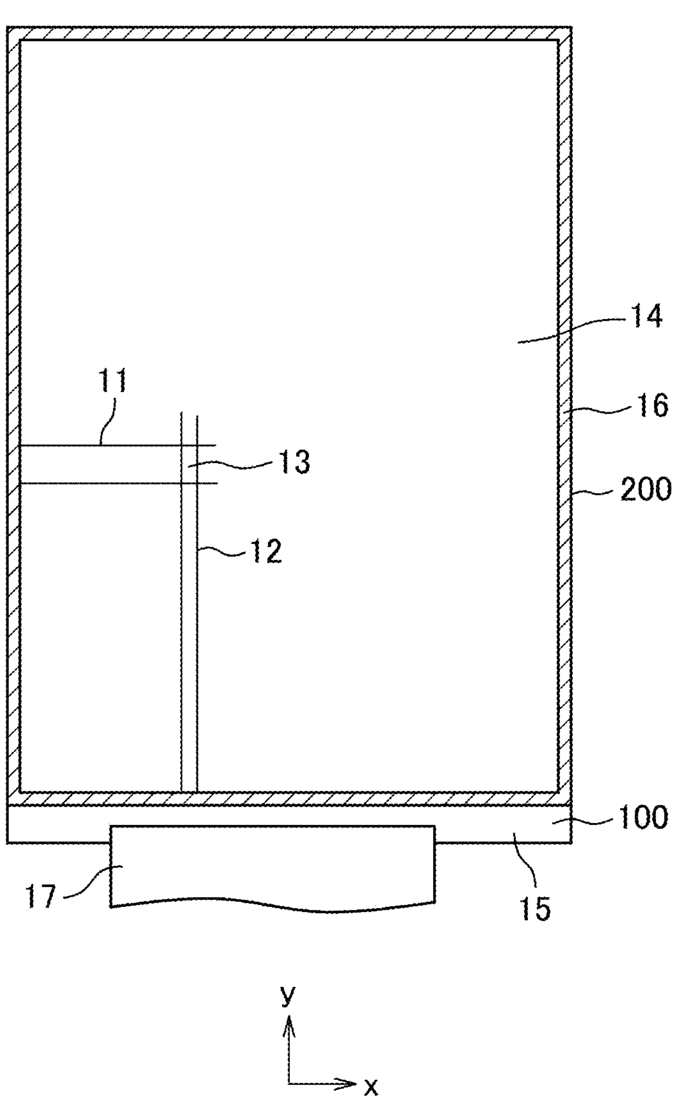
FIG. 1 is a plan view of a liquid crystal display device.

FIG. 1 is a plan view of a liquid crystal display device to which the present invention is applied. In FIG. 1, the TFT substrate 100 and the counter substrate 200 are bonded together by a sealant 16, and a liquid crystal layer is sandwiched between the TFT substrate 100 and the counter substrate 200. A display region 14 is formed at a portion where the TFT substrate 100 and the counter substrate 200 overlap.

In the display region 14 of the TFT substrate 100, scanning lines 11 extend in the horizontal direction (x-direction) and are arranged in the vertical direction (y-direction). Further, the video signal lines 12 extend in the vertical direction and are arranged in the horizontal direction. A region surrounded by the scanning line 11 and the video signal line 12 becomes a pixel 13. Note that a pixel having such a configuration is sometimes called a sub-pixel, however, it is referred to as a pixel in this specification. In a high-definition screen, a size of a pixel in an x-direction is 30 μm or less, and may be reduced to about 20 μm.

The TFT substrate 100 is formed larger than the counter substrate 200, and a portion where the TFT substrate 100 does not overlap with the counter substrate 200 is a terminal region 15. A flexible wiring board 17 is connected to the terminal region 15. A driver IC for driving a liquid crystal display device is mounted on a flexible wiring board 17.

Since the liquid crystal does not emit light, a backlight is disposed on the back surface of the TFT substrate 100. A liquid crystal display panel forms an image by controlling light from a backlight for each pixel. The flexible wiring board 17 is bent on the back surface of the backlight so as to reduce the overall outer shape of the liquid crystal display device.

Figure 2:
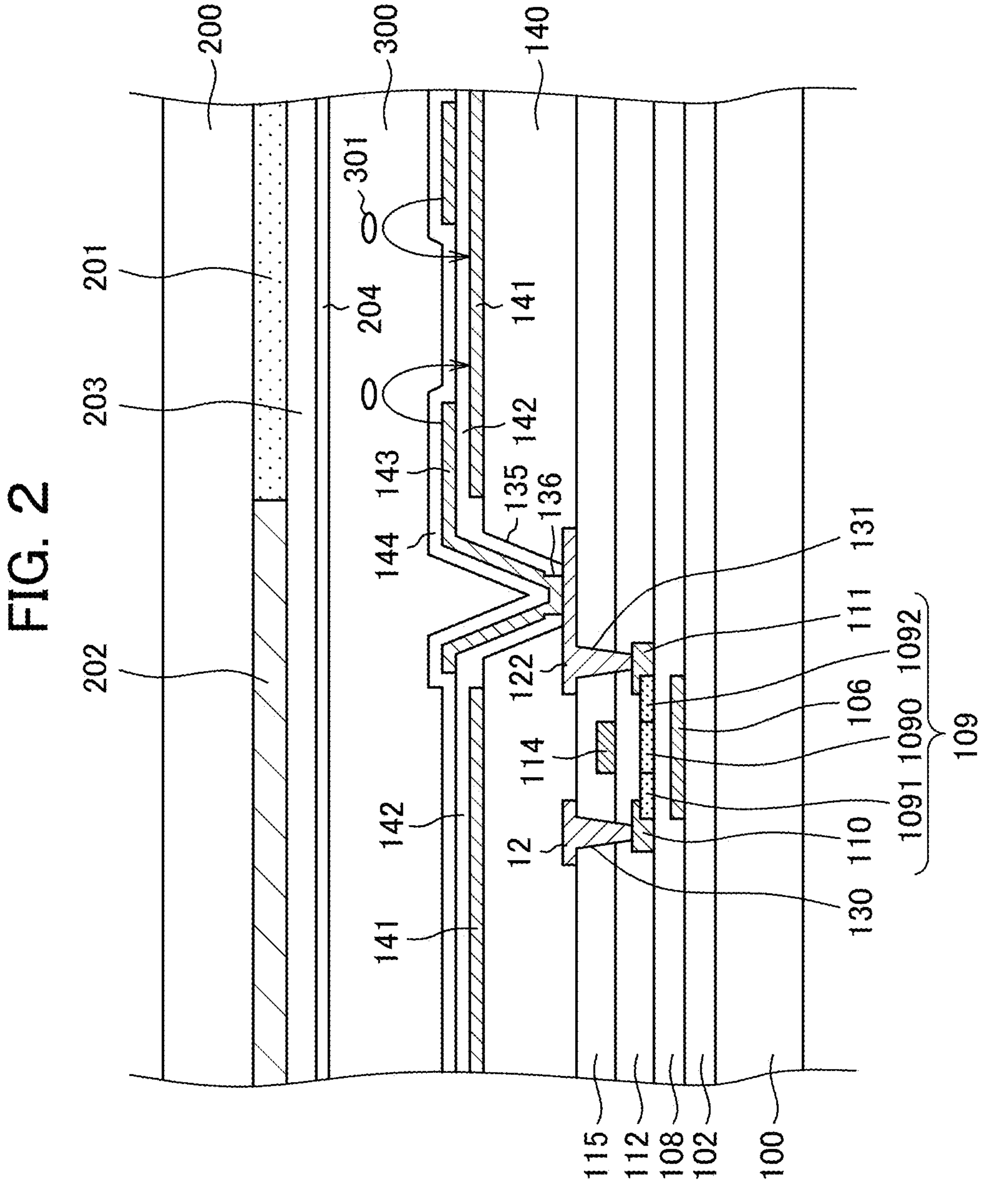
FIG. 2 is a cross sectional view of a display region of a liquid crystal display device.

FIG. 2 is a cross-sectional view of a display region in which a pixel is present. FIG. 2 is a liquid crystal display device called an FFS (Fringe Field Switching) mode, which belongs to an IPS (In Plane Switching) mode. In FIG. 2, a TFT including an oxide semiconductor film 109 (it may be called as an oxide semiconductor TFT) is used. Since the oxide semiconductor TFT has a small leakage current, it is suitable as a switching TFT. However, as will be described later, as channel length decreases, operational stability becomes a problem.

In FIG. 2, a base film 102 is formed covering the TFT substrate 100. The base film 102 prevents the oxide semiconductor film 109 from being contaminated by impurities from the TFT substrate 100, formed of glass or resin such as polyimide. In many cases, the base film 102 is formed of a stacked film of a silicon oxide film (SiO) and a silicon nitride film (SiN).

A light shielding film 106 is formed of a metal on a base film 102. As the metal, the same metal as a gate electrode or the like described later may be used. The light shielding film 106 is used to shield the channel portion of the TFT, to be formed later, from being irradiated with light from the backlight. If necessary, the light-shielding film 106 may be used as a shield electrode for preventing the oxide semiconductor TFT from being affected by a charged substrate 100. Further, it can be used as a lower gate electrode by applying a gate voltage. A structure in which the light-shielding film 106 is not provided may be used.

A buffer insulating film 108 is formed covering the light-shielding film 106. The buffer insulating film 108 is formed of a silicon oxide film. Note that when the light-shielding film 106 is used as a lower gate electrode, the buffer insulating film 108 functions as a lower gate insulating film.

In FIG. 2, an oxide semiconductor film 109 constituting a TFT is formed on a buffer insulating film 108. The oxide semiconductor film 109 can be formed by sputtering. The oxide semiconductor film 109 has a thickness of 10 to 100 nm. In this embodiment, an IGZO film having a thickness of, e.g., 50 nm is used for the oxide semiconductor film 109.

The semiconductor film 109 includes a channel region 1090, a drain region 1091, and a source region 1092. As will be described later, the drain region 1091 and the source region 1092 are rendered conductive by ion implantation using the gate electrode 114 as a mask. A channel region 1090 is formed immediately below the gate electrode 114.

A drain electrode 110 is stacked at one end of the oxide semiconductor film 109, and a source electrode 111 is stacked at the other end. The drain electrode 110 and the source electrode 111 can be formed of the same metal as that of the gate electrode 114, or can be formed of a film containing Ti. In the oxide semiconductor film 109, a portion which is stacked on the drain electrode 110 and the source electrode 111 becomes conductive.

A gate insulating film 112 is formed of SiO covering the oxide semiconductor film 109, the drain electrode 110, and the source electrode 111. The gate insulating film 112 supplies oxygen to the channel region 1090 of the oxide semiconductor film 109 to stabilize characteristics of the oxide semiconductor TFT.

Figure 3:
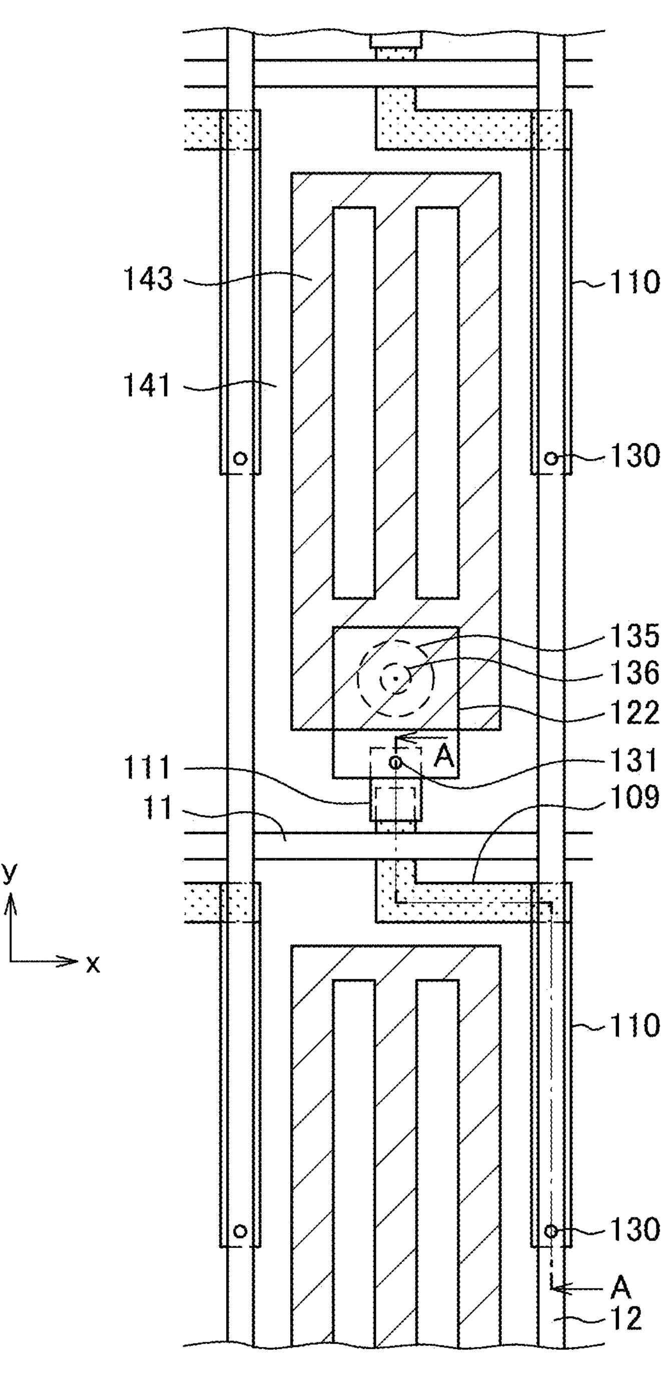
FIG. 3 is a plan view of a pixel corresponding to FIG. 2.
Figure 4:
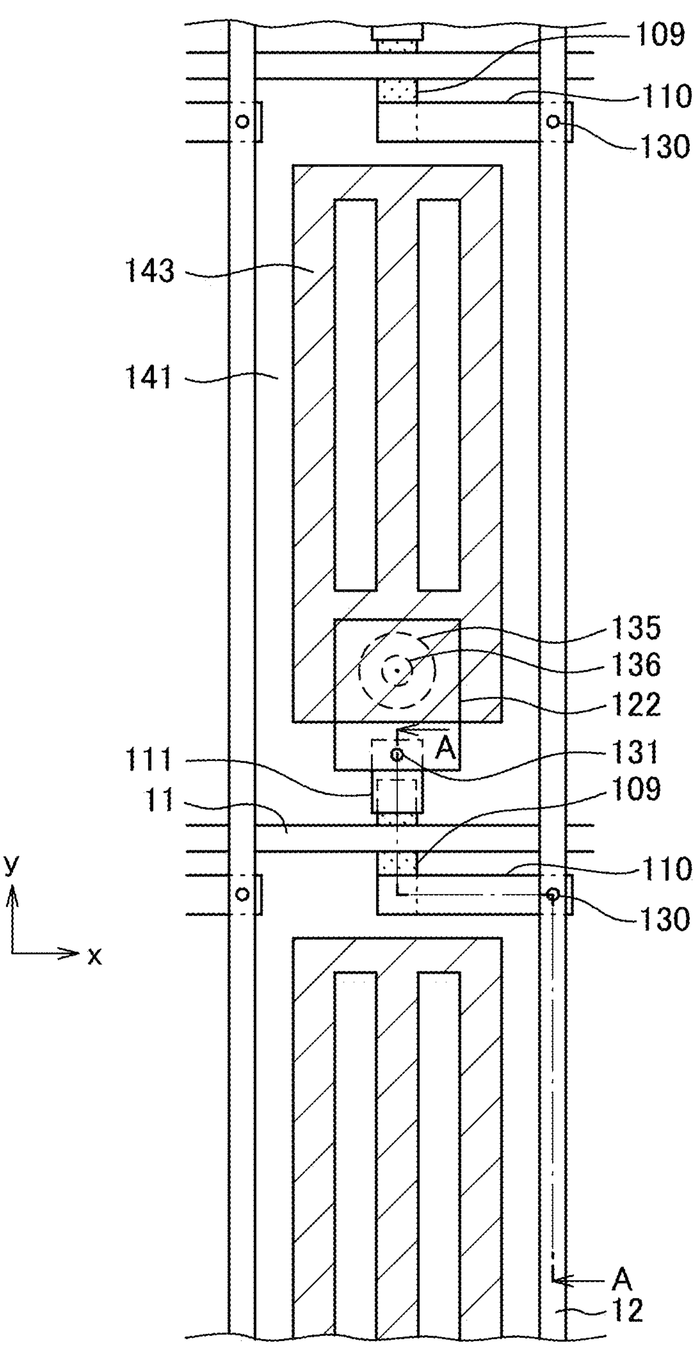
FIG. 4 is a plan view of a pixel of another structure corresponding to FIG. 2.

A gate electrode 114 is formed on the gate insulating film 112. The gate electrode 114 is formed of, for example, a stacked film of Ti—Al—Ti (Titan-Aluminum-Titan) or a MoW alloy. As shown in FIGS. 3 and 4, in this embodiment, a scanning line 11 is also used as the gate electrode 114.

Although omitted in FIG. 2, an aluminum oxide film or an oxide semiconductor film may be formed between the gate electrode 114 and the gate insulating film 112. The purpose is to further stabilize the characteristics of a TFT by supplying more oxygen to a channel region 1090 of an oxide semiconductor film 109. In this case, the aluminum oxide film may have a thickness of about 10 nm.

An interlayer insulating film 115 is formed covering the gate electrode 114. In many cases, the interlayer insulating film 115 has a 2 layer structure of a silicon oxide film and a silicon nitride film. In the present embodiment, a silicon nitride film is provided on the side of the TFT substrate 100 and a silicon oxide film is provided on the upper side of the silicon nitride film; however, the order of stacking can be reversed.

In FIG. 2, a through hole 130 is formed in the interlayer insulating film 115 and the gate insulating film 112 to connect a video signal line 12 and a drain electrode 110, and a through hole 131 is formed to connect the contact electrode 122 and the source electrode 111. The contact electrode 122 extends over the interlayer insulating film 115 and is connected to the pixel electrode 143 via the through holes 135 and 136.

In FIG. 2, an organic passivation film 140 is formed covering the interlayer insulating film 115. The organic passivation film 140 is formed of, for example, an acrylic resin or the like. The organic passivation film 140 serves as a planarization film and is formed to have a thickness of about 2 to 4 μm in order to reduce a stray capacitance between the video signal line 12 and the common electrode 141. In order to connect the contact electrode 122 and the pixel electrode 114, a through hole 135 is formed in the organic passivation film 140.

A common electrode 141 is formed on the organic passivation film 140 by a transparent conductive film such as ITO (Indium Tin Oxide). The common electrode 141 is formed in a planar shape. A capacitor insulating film 142 is formed of silicon nitride covering the common electrode 141. A pixel electrode 143 is formed of a transparent conductive film such as ITO covering the capacitor insulating film 142. The pixel electrode 143 is formed in a comb shape. Since the capacitance insulating film 142 constitutes a pixel capacitance between the common electrode 141 and the pixel electrode 143, this is referred to as this.

An alignment film 144 is formed covering the pixel electrode 143. The alignment film 144 defines an initial alignment direction of the liquid crystal molecules 301. For alignment treatment of the alignment film 144, alignment treatment by rubbing or photo-alignment treatment using polarized ultraviolet rays is used. Since no pretilt angle is required in the IPS mode, a photo-alignment process is advantageous.

In FIG. 2, a counter substrate 200 is disposed opposing to a TFT substrate 100 with a liquid crystal layer 300 interposed therebetween. A color filter 201 and a black matrix 202 are formed on a counter substrate 200, and an overcoat film 203 is formed thereon. An alignment film 204 is formed on the overcoat film 203. The action of the alignment film 204 and an alignment method of the alignment film 204 are the same as those of the alignment film 144 of the TFT substrate 100.

In FIG. 2, when a voltage is applied between the common electrode 141 and the pixel electrode 143, an electric force line as shown by an arrow in FIG. 2 is generated, and the liquid crystal molecules 301 are rotated to control the transmittance of light from the backlight of the liquid crystal layer 300. An image is formed by controlling the transmittance of light for each pixel.

FIG. 3 is a plan view of a pixel in a display region of a liquid crystal display device corresponding to FIG. 2. In FIG. 3, the scanning lines 11 extend in the horizontal direction (x-direction) and are arranged in the vertical direction (y-direction). Further, the video signal lines 12 extend in the vertical direction and are arranged in the horizontal direction. A pixel electrode 143 is formed in an area surrounded by the scanning line 11 and the video signal line 12. An oxide semiconductor TFT is formed between the video signal line 12 and the pixel electrode 143. In FIG. 3, the light-shielding film is omitted.

In FIG. 3, the drain electrode 110 is connected to the video signal line 12 via the through hole 130, and extends, under the video signal line 12, in the direction of the oxide semiconductor TFT formed in the adjacent pixel in the y direction. The oxide semiconductor film 109 extends in an L-shape, and one end thereof is stacked with the drain electrode 110 under the video signal line 12. The oxide semiconductor film 109 passes under the scanning line 11, and at this time, a channel of the TFT is formed. In FIG. 3, the scanning line 11 also serves as the gate electrode 114 in FIG. 2. The scanning line 11 has a width of 2 to 3 μm. The oxide semiconductor film 109 is doped with boron (B), for example, by ion implantation, except for a channel portion immediately below the scanning line 11, and is electrically conductive. In addition to boron, phosphorus (P) or argon (Ar) may be used as ions for ion implantation. An ion-implanted portion of the oxide semiconductor film 109 is an n-type semiconductor region, concretely, n+ region (highly doped n-type region).

The other end of the oxide semiconductor film 109 is stacked and connected to the source electrode 111. The source electrode 111 extends toward the pixel electrode 143 and is connected to the contact electrode 122 via the through hole 131. The contact electrode 122 is connected to the pixel electrode 143 via a through-hole 135 formed in the organic passivation film 140 and a through-hole 136 formed in the capacitance insulating film. The pixel electrode 143 is formed in a comb shape.

A common electrode 141 is formed in a planar shape under the pixel electrode 143. When a voltage is applied to the pixel electrode 143, as described with reference to FIG. 2, an electric force line is generated between the pixel electrode 21 and the common electrode 141 to rotate the liquid crystal molecules, thereby controlling the transmittance of the liquid crystal in the pixel.

FIG. 4 is a plan view of another example of a pixel in a display region of a liquid crystal display device corresponding to FIG. 2. FIG. 4 is different from FIG. 3 in that the oxide semiconductor film 109 is made shorter. In FIG. 4, a video signal line 12 and a drain electrode 110 are connected to each other via a through hole 130. The drain electrode 110 extends leftward and is stacked on and connected to the oxide semiconductor film 109. In this embodiment, the connection portion between the oxide semiconductor film 109 and the drain electrode 110 is not overlapped with the video signal line but is spaced apart from the scanning line 11 and the video signal line 12, and is provided in a region surrounded by the scanning line and the video signal line. With this configuration, the distance of the drain region 1091 of the oxide semiconductor film can be shortened.

The oxide semiconductor film 109 extends in the vertical direction (y direction), and a channel is formed when passing under the scanning line 11. Other configurations are similar to those described in FIG. 3. As described above, the oxide semiconductor film 109 may have various shapes. According to the present invention, it is possible to reduce the resistance of the drain region and the source region by ion implantation. Therefore, even if the length of the drain region is longer than the length of the source region as in the configuration shown in FIG. 3, the ON current of the TFT is not significantly affected by the length of the source region (2 times or more the length of the source region). However, when it is desired to reduce the resistance of the oxide semiconductor film and to increase the ON current of the TFT, it is also possible to set the length of the drain region to be approximately equal to the length of the source region (1 to 2 times) as shown in FIG. 4. In addition, the length of the source region and the length of the drain region (distance from the channel region to each electrode) may range from 2 to 30 μm. In FIG. 4, the length of the drain region is set to 3 μm. According to the application of the present invention, since the length of the source region or the length of the drain region can be increased to 30 μm, the degree of freedom in the layout of the TFT can be increased. Therefore, the oxide semiconductor film can be provided in a region not overlapping with the black matrix 202 included in the counter substrate 200. In other words, an oxide semiconductor film may be overlapped on a portion of a display region of a pixel. The structure of the present invention described below can be applied to any shape of the oxide semiconductor film 109.

Figure 5:
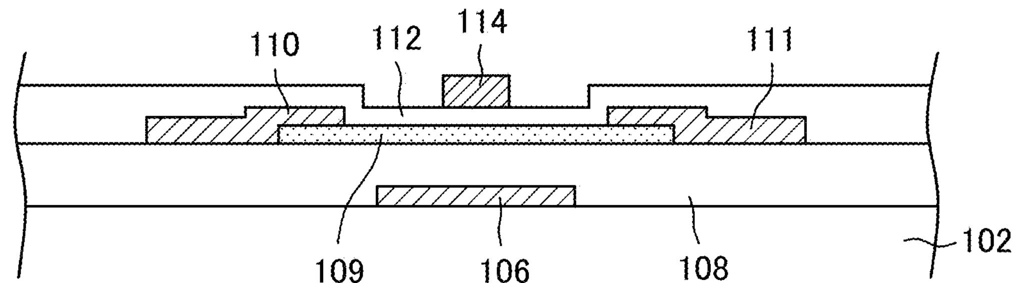
FIG. 5 is a cross-sectional view of a process to form an oxide semiconductor TFT.
Figure 6:
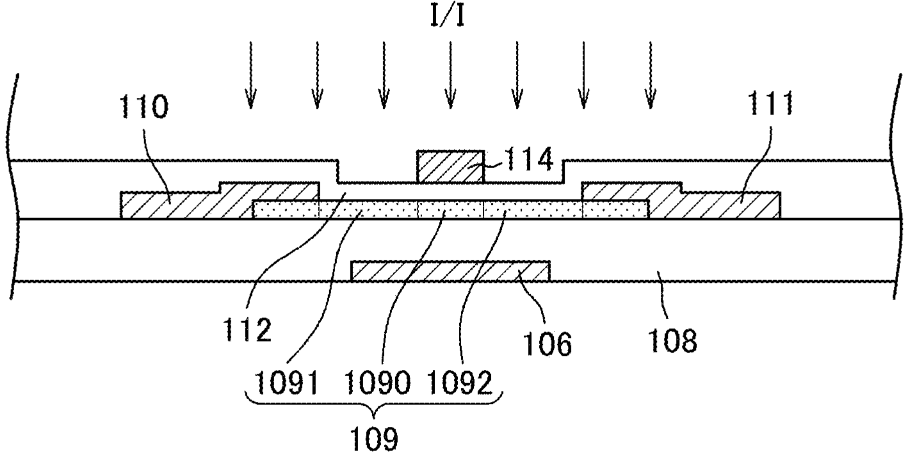
FIG. 6 is a cross-sectional view of showing ion implantation to an oxide semiconductor.
Figure 7:
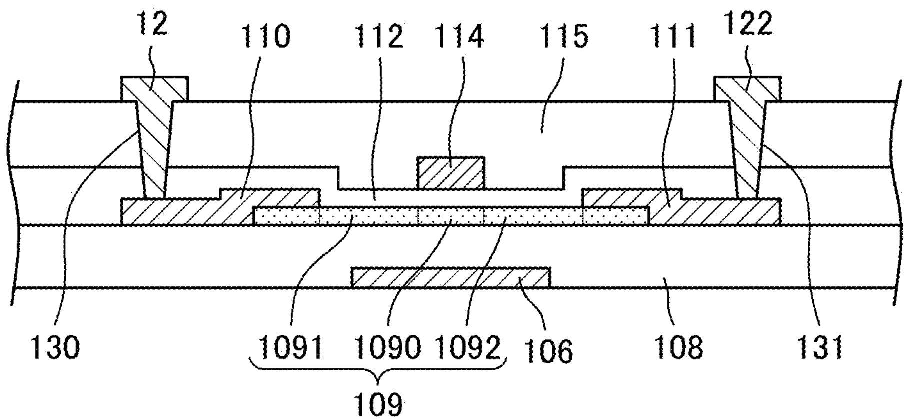
FIG. 7 is a detailed cross-sectional view of an oxide semiconductor.

FIGS. 5 to 7 are cross-sectional views illustrating a manufacturing process in the vicinity of the oxide semiconductor TFT in FIG. 2. FIG. 5 is a sectional view showing a state where the gate electrode 114 is formed. In FIG. 5, a buffer insulating film 108 made of a silicon oxide film is formed by PECVD (Plasma Enhanced Chemical Vapor Deposition) covering the light-shielding film 106. Thereafter, the oxide semiconductor film 109 is formed of IGZO and patterned. Thereafter, a metal film serving as the drain electrode 110 and the source electrode 111 is formed of a film containing Ti and patterned. A gate insulating film 112 is formed of a silicon oxide film by PECVD so as to cover the oxide semiconductor film 109, the drain electrode 110, and the source electrode 111. A gate electrode 114 is formed on the gate insulating film 112 and is patterned.

Thereafter, as shown in FIG. 6, boron (B) is doped into the oxide semiconductor film 109 by ion implantation (I/I). Although phosphorus (P), argon (Ar), and the like can be used as ions for ion implantation, boron (B) is most effective for imparting conductivity (lower resistance) of the oxide semiconductor film 109 according to experiments conducted by the inventor.

As shown in FIG. 6, since the ion implantation is performed using the gate electrode 114 as a mask, a channel region 1090 not doped with boron is formed under the gate electrode 114 after ion implantation. A drain region 1091 doped with boron is formed between the gate electrode 114 and the drain electrode 110, and a source region 1092 doped with boron is formed between the gate electrode 114 and the source electrode 111.

Thereafter, as shown in FIG. 7, an interlayer insulating film 115 including a silicon nitride film is formed and annealed. At this time, hydrogen is supplied from the silicon nitride film to the drain region 1091 and the source region 1092 of the oxide semiconductor 109, thereby imparting conductivity to the drain region 1091 and the source region 1092. Thereafter, the through hole 130 is formed to connect the drain electrode 110 and the video signal line 12 to each other, and the through hole 131 is formed to connect the source electrode 111 and the common electrode 122 to each other.

Figure 8:
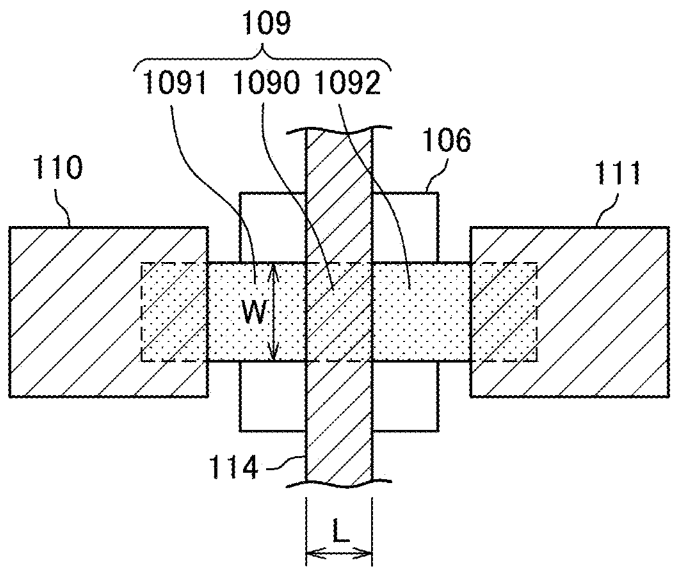
FIG. 8 is a plan view of an oxide semiconductor.

FIG. 8 is a plan view of the oxide semiconductor TFT shown in FIG. 7. The TFT shown in FIG. 8 is rotated by 90 degrees from the TFT shown in FIG. 3 or 4. In FIG. 8, an oxide semiconductor film 109 is formed over a light-shielding film 106. A drain electrode 110 is stacked on one end of the oxide semiconductor film 109, and a source electrode 111 is stacked on the other end. A gate electrode 114 is formed covering the vicinity of the center of the oxide semiconductor film 109.

In FIG. 8, the shape of channel 1090 is defined by gate electrode 114. In FIG. 8, the channel length is L and the channel width is W. The drain region 1091 and the source electrode 1092 of the oxide semiconductor 109 are provided with conductivity due to doping of boron (B) by ion implantation.

Figure 9:
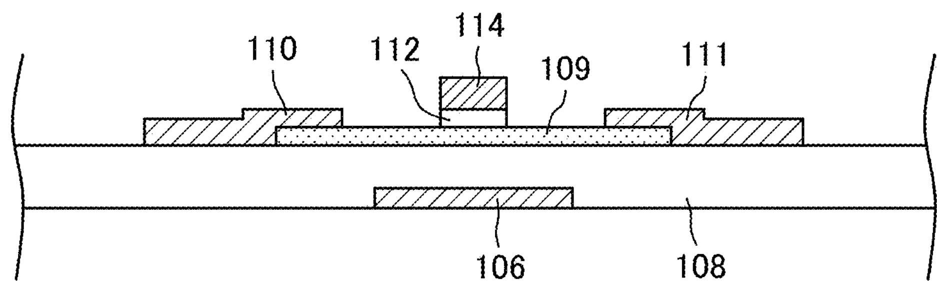
FIG. 9 is a cross-sectional view of a process to form an oxide semiconductor TFT of another structure.
Figure 10:
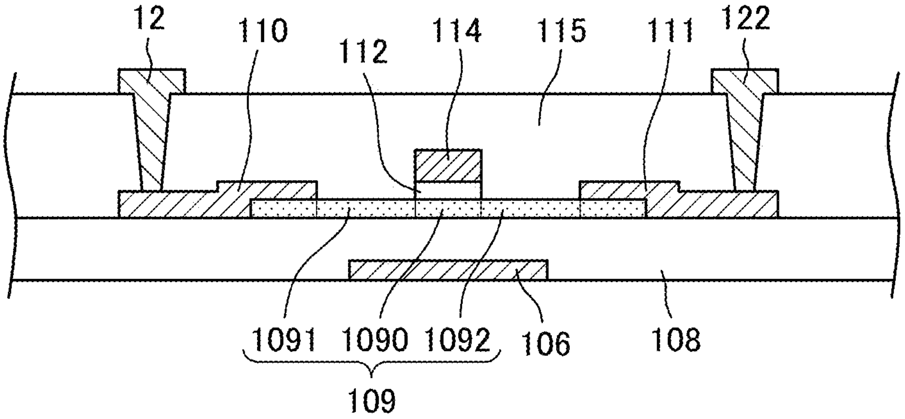
FIG. 10 is a cross-sectional view of an oxide semiconductor TFT of another structure

FIGS. 9 and 10 are cross-sectional views illustrating a case in which conductivity is given to the drain region 1091 and the source region 1092 of the oxide semiconductor film 109 by another method. FIG. 9 is a cross-sectional view showing a state in which the gate electrode 114 is formed. In FIG. 9, it is the same as FIG. 6 until the drain electrode 110 and the source electrode 111 are formed. In FIG. 9, after forming the gate insulating film 112 and the gate electrode 114, the gate insulating film 112 is patterned using the gate electrode 114 as a mask.

The gate insulating film 112 can be patterned by F (fluorine) based dry etching. The oxide semiconductor 105 is hardly etched by F (fluorine) based dry etching. FIG. 9 is a cross-sectional view showing a state in which SiO is removed by F type dry etching and the gate insulating film 106 is patterned. In FIG. 9, the gate insulating film 112 is formed only under the gate electrode 114.

Thereafter, as shown in FIG. 10, an interlayer insulating film 115 including a silicon nitride film is formed covering the gate electrode 114, the oxide semiconductor film 109, and the like. The interlayer insulating film 115 is formed of a stacked film of a silicon oxide film and a silicon nitride film. Thereafter, hydrogen is supplied from the silicon nitride film to the drain region 1091 and the source region 1092 of the oxide semiconductor film 109 by annealing, and the oxide semiconductor film 109 is reduced to impart conductivity to the drain region 1091 and the source region 1092.

Which of the silicon nitride film and the silicon oxide film is formed as a lower layer is determined depending on the stability of the channel characteristics of the oxide semiconductor TFT and the resistance of the drain region 1091 and the source region 1092. In any case, the configuration of FIG. 10 tends to gradually move hydrogen from the silicon nitride film into channel region 1090 for a long period of time to change the channel characteristics.

Figure 11:
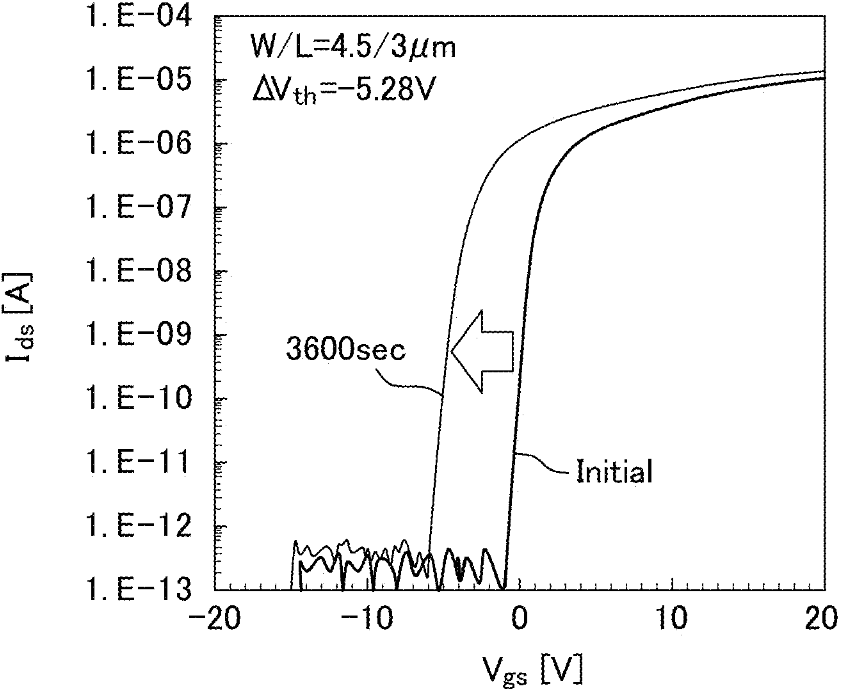
FIG. 11 is a graph showing a change in characteristics of an oxide semiconductor TFT of the structure of FIG. 10 before and after the accelerated test.

The change in the characteristics of the TFT can be evaluated by changing the threshold voltage Vth of the TFT. FIG. 11 shows changes in the threshold voltage Vth of the TFT before and after an acceleration test called a NBTIS (Negative Bias Illumination Temperature Stress) is performed on the oxide semiconductor TFT having the configuration shown in FIG. 10. In this case, the channel width of the TFT is 4.5 μm and the channel length is 3 μm.

In this case, the condition of NBTIS is: Vgs=−20 V, Vd=−Vs=GND, the amount of light applied from the rear surface is 4500 cd/$m^2$, acceleration test time is 3600 seconds at 60° C. In FIG. 11, the horizontal axis represents Vgs (V), and the vertical axis represents Ids (A). Ids means drain current. As shown in FIG. 11, the change in Vth before and after the acceleration test is −5.28 V and is a relatively large value.

Figure 12:
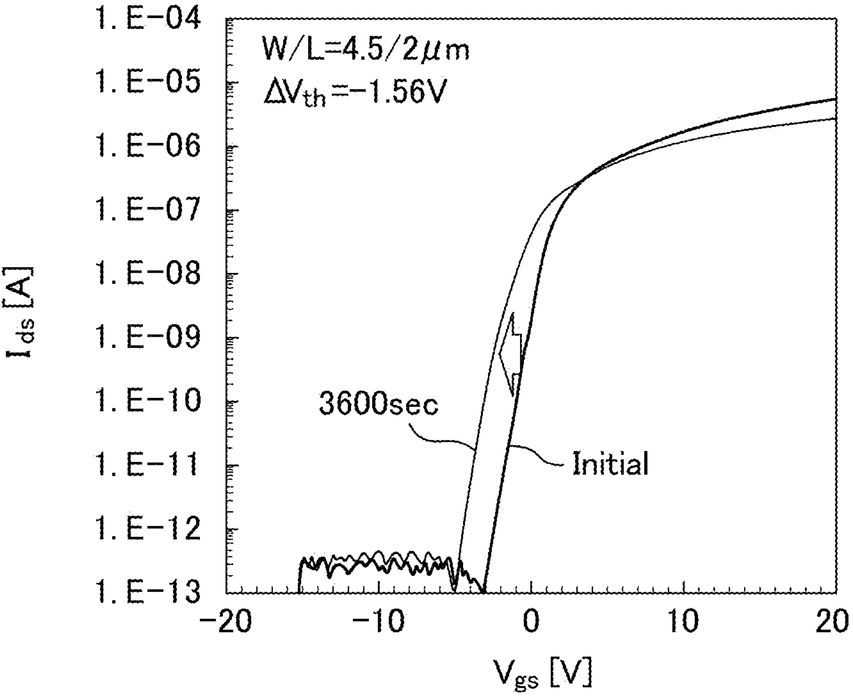
FIG. 12 is a graph showing a change in characteristics of an oxide semiconductor TFT of the present invention before and after the accelerated test.

FIG. 12 is a graph showing the change in Vth when the same NBTIS test is performed on the TFT structure in which conductivity is given to the drain region 1091 and the source region 1092 of the TFT using the ion implantation shown in FIG. 7. In this case, the channel width of the TFT is 4.5 μm and the channel length is 2 μm. In other words, in FIG. 12, the channel length of the TFT is shorter than in the case of FIG. 11, so that it is easily affected by the acceleration test.

However, as shown in FIG. 12, in the configuration of FIG. 7, the change of Vth before and after the acceleration test is −1.56 V, which is smaller than that of FIG. 11. In other words, a configuration in which conductivity is imparted to the drain region 1091 and the source region 1092 of the TFT using ion implantation has more stable TFT characteristics than that of a configuration in which conductivity is imparted to the drain region 1091 and the source region 1092 of the TFT not using ion implantation as shown in FIG. 10.

Figure 13:
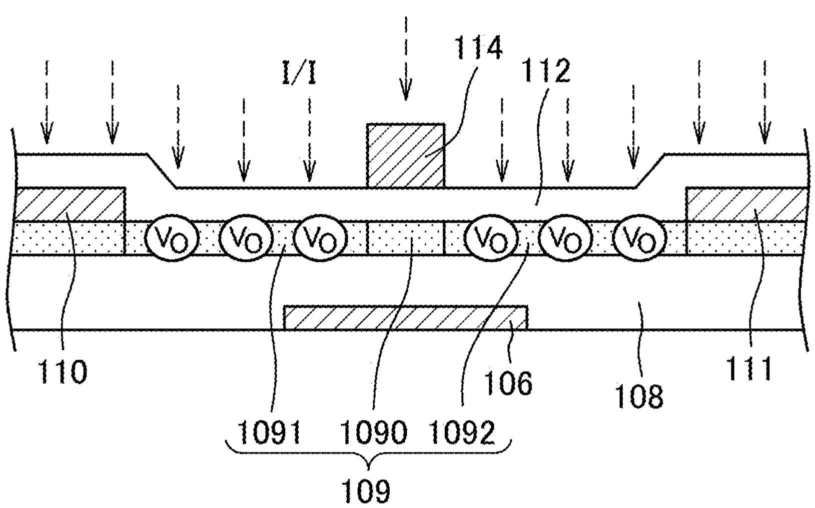
FIG. 13 is a cross-sectional view to show a mechanism to form the oxide semiconductor TFT of the present invention.
Figure 14:
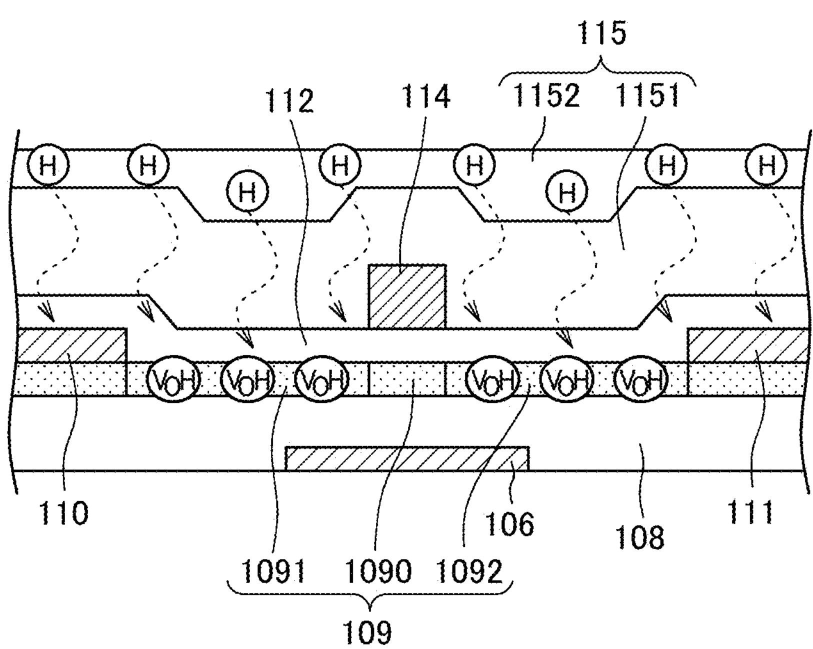
FIG. 14 is another cross-sectional view to show a mechanism to form the oxide semiconductor TFT of the present invention.

FIGS. 13 and 14 are schematic cross-sectional views illustrating a mechanism for imparting conductivity to the drain region 1091 and the source region 1092 using ion implantation according to the present invention. FIG. 13 is a cross-sectional view showing a state in which an oxygen-deficient portion (oxygen vacancies) Vo is formed in the oxide semiconductor film 109 by implanting ions, for example, boron (B) into the oxide semiconductor film 109 by ion implantation. By forming the oxygen-deficient portion, conductivity is given to the drain region 1091 and the source region 1092 of the oxide semiconductor film.

FIG. 14 is a cross-sectional view showing a state in which an interlayer insulating film is formed so as to cover the oxide semiconductor film 109 and the gate electrode 114. In FIG. 14, the interlayer insulating film 115 has a 2 layer structure, and a lower side is a silicon oxide film 1151, and an upper side is a silicon nitride film 1152. In FIG. 14, hydrogen is supplied from the silicon nitride film 1152 to the drain region 1091 and the source region 1092 of the oxide semiconductor through the silicon oxide film 1151 and the gate insulating film 112, and the oxide semiconductor 109 is reduced by hydrogen to further impart conductivity.

As shown in FIG. 14, hydrogen supplied from the silicon nitride film 1152 constituting the interlayer insulating film 115 and imparting conductivity to the drain region 1091 and the source region 1092 of the oxide semiconductor film is taken into the oxygen-deficient portion Vo of the drain region 1091 and the source region 1092 and cannot be moved. Therefore, even in the acceleration test, hydrogen does not move to the channel region 1090, so that there is no significant change in the characteristics of the TFT.

Therefore, performing a simple ion implantation is not enough. By defining the relationship between the amount of hydrogen supplied from the silicon nitride film 1152 constituting the interlayer insulating film and the dose of ions in ion implantation, i.e., the density of the oxygen-deficient portion Vo, a more stable oxide semiconductor TFT can be formed. Although FIG. 14 shows an example in which the silicon nitride film 1152 is formed as an upper layer, the silicon oxide film 1151 may be an upper layer with the silicon nitride film 1152 as a lower layer when a larger amount of hydrogen is desired to be supplied to the drain region 1091 and the source region 1092 of the oxide semiconductor film 109.

Figure 15:
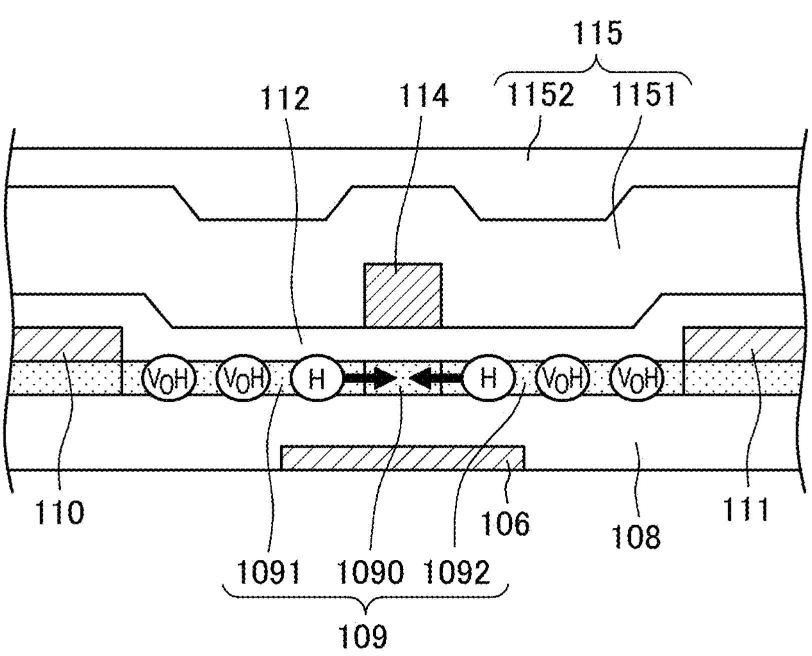
FIG. 15 is a cross-sectional view to show a mechanism when a defect occurs in an oxide semiconductor TFT.

FIG. 15 shows a case where a large amount of hydrogen is supplied from the interlayer insulating film 1152 in the oxide semiconductor 109 when a dose amount by ion implantation is small and a density of the oxygen-deficient portion Vo is small. In this case, hydrogen that is not taken into the oxygen-deficient portion Vo diffuses into the channel region in the acceleration test, and changes the characteristics of the TFT.

Figure 16:
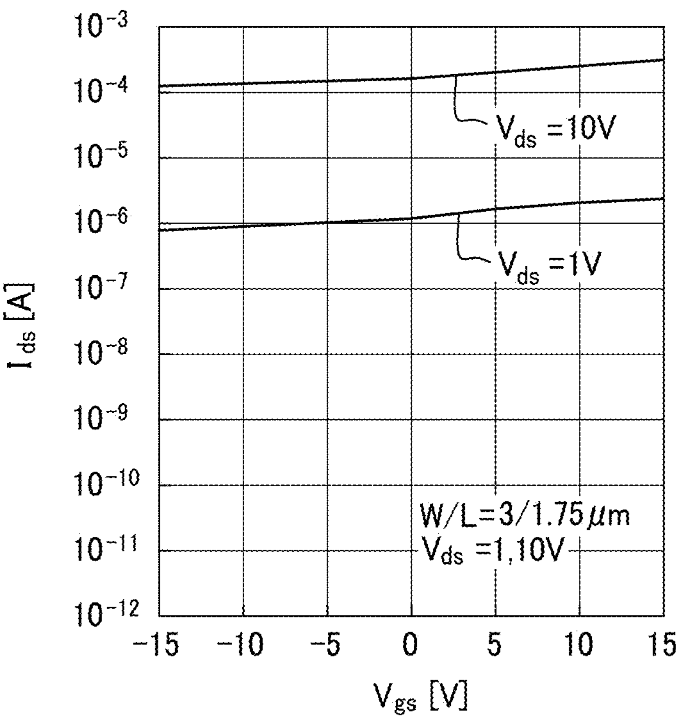
FIG. 16 is a graph of characteristics when an oxide semiconductor TFT is depleted by a defect described in FIG. 15.

In such a case, when the channel length of the TFT decreases, there is a risk that the resistance of the channel region decreases and the TFT becomes conductive, i.e., depletion occurs. FIG. 16 shows characteristics when the TFT is depleted after an acceleration test. The channel width of the TFT is 3 μm and the channel length is 1.75 μm. In FIG. 16, the horizontal axis represents Vgs (V), and the vertical axis represents Ids (A). The TFT shown in FIG. 16 cannot function as a switching TFT.

Figure 17:
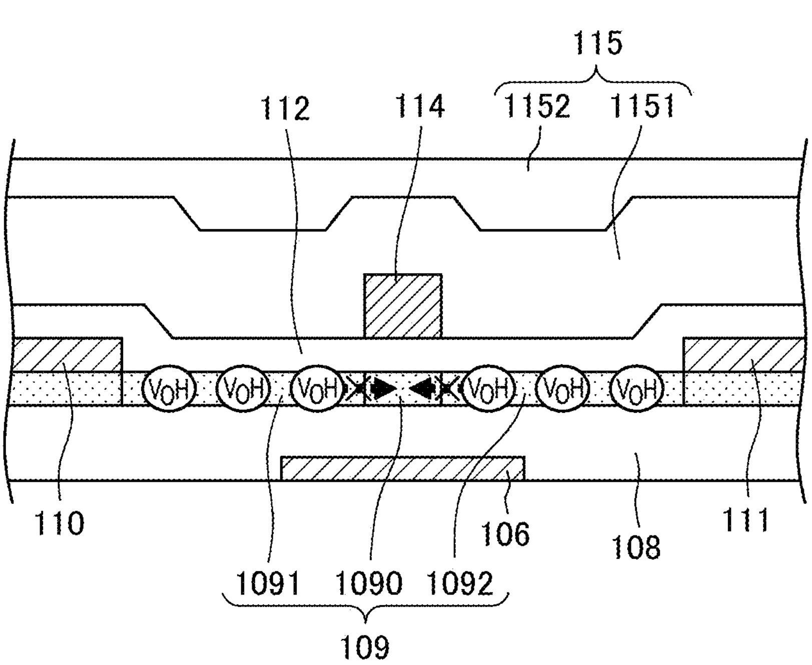
FIG. 17 is a cross-sectional view of an oxide semiconductor TFT when the structure of embodiment 1 operates normally.

FIG. 17 shows a case in which a dose by ion implantation is large and a density of the oxygen-deficient portion Vo is large. In FIG. 17, hydrogen supplied from the interlayer insulating film 1152 is taken into the oxygen-deficient portion Vo. Therefore, even in an accelerated test, hydrogen cannot move to the channel region 1090. In FIG. 17, X indicates that hydrogen does not move into the channel region 1090. Therefore, even after the acceleration test, the characteristics of the TFT do not change.

Figure 18:
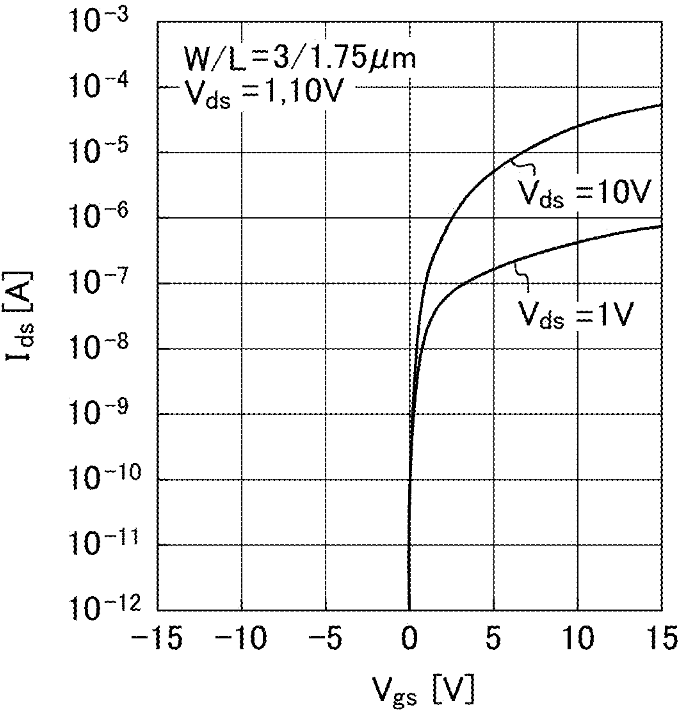
FIG. 18 is a graph of characteristics of the oxide semiconductor TFT of embodiment 1 when it operates normally.

In this case, even when the channel length of the TFT is small, the characteristics of the TFT can be stably maintained even after the acceleration test. FIG. 18 shows a case where the characteristics of the TFT shown in FIG. 17 are measured after an accelerated test. In FIG. 18, the channel width of the TFT is 3 μm and the channel length is 1.75 μm. Even if the channel shape of the TFT is the same, as shown in FIG. 18, the TFT operates normally.

As described above, in order to stabilize the characteristics of the TFT, the amount of hydrogen contained in the interlayer insulating film 1152 and the amount of ion implantation into the oxide semiconductor film 109 have a large influence. The interlayer insulating film 1152 is formed by plasma enhanced CVD (PECVD); the amount of hydrogen contained in the interlayer insulating film 1152 can be appropriately controlled according to the conditions of PECVD.

As the PECVD gas, for example, silane ($SiH_4$), ammonia ($NH_3$), and nitrogen ($N_2$) can be used. The flow ratio of silane to ammonia is set, for example, to 1/10 to 1/30. The nitrogen flow rate is adjusted so that the film forming pressure can be controlled. The film forming temperature is, for example, 250° C. to 400° C. The thickness of the interlayer SiN film 104 is adjusted according to the amount of hydrogen contained in the interlayer SiN film 104, but is generally 50 to 500 nm.

On the other hand, the dose of ions to the oxide semiconductor film by ion implantation can be accurately controlled. Although the condition of ion implantation varies depending on the thickness of the gate insulating film 112 formed on the oxide semiconductor, for example, in the configuration of FIG. 6, the acceleration voltage is 35 kev and the dose of ions is $5\times10^{14}$ atoms/$cm^2$.

The performance of the TFT can be evaluated by the field effect mobility (μFE), the variation in threshold voltage Vth, the sheet resistance of the source region and the drain region, and the like. That is, the larger the field-effect mobility (μFE) is, the better. It is preferable that the threshold voltage Vth is close to 0 V and the variation is small. Further, as the sheet resistance of the source region and the drain region becomes smaller, the ON current can be increased. In addition to the above performance, it is necessary for the TFT to have a small change in characteristics in an acceleration test.

Incidentally, a large number of liquid crystal display panels are formed on a large mother substrate at the same time, and therefore, it is also necessary that a variation in characteristics between the respective panels in the substrate is small. FIG. 19 is a table showing typical characteristics of TFTs in each liquid crystal display panel when a large number of liquid crystal display panels are formed on a substrate (1500×1800).

In FIG. 19, the upper two lines represent the manufacturing conditions of the TFT, and the lower three lines represent the performance and variation of the TFT. In the measurement, the performance of the TFT in the 22 liquid crystal display panels in the G6 substrate is measured. That is, the field effect mobility (μFE) and the sheet resistance of the source/drain represent an average of 22 samples, and the threshold voltage Vth represents a variation of 22 samples.

In FIG. 19, when the hydrogen content of the interlayer insulating film is small and the dose by ion implantation is small, the TFT cannot obtain sufficient performance for each characteristic. On the other hand, even if the hydrogen content of the interlayer insulating film is small, if the dose of ion implantation is increased, a certain degree of performance can be obtained.

In FIG. 19, when the hydrogen content of the interlayer insulating film is optimized, even when the dose amount in the ion implantation is either small or large, the performance of the TFT is relatively acceptable. In particular, when the hydrogen content of the interlayer insulating film is optimized and the dose of ion implantation is increased, the TFT performance can be high and the variation in the substrate can be small.

In FIG. 19, the channel width of the TFT is 3 μm and the channel length is 2 μm. TFT of such small size was not able to be manufactured stably conventionally. According to the present invention, a fine TFT having a channel length of 2 μm or less can be realized by a structure based on the knowledge of a mechanism for trapping hydrogen from a silicon nitride film constituting an interlayer insulating film by ion implantation.

In FIG. 19, as a representative characteristic of the TFT reflecting the knowledge of the present invention, a sheet resistance of the source/drain region can be mentioned. Namely, the doze amount in ion implantation and the amount of hydrogen supplied from the interlayer insulating film 1152 are reflected in the sheet resistance of the source/drain region. In addition, the sheet resistance of the source/drain region has a large influence on the ON-current of the TFT and also has a large relationship with the reliability of the TFT. For example, by simply reducing the sheet resistance, hydrogen diffuses into the channel region in an acceleration test, and the TFT is depleted.

In accordance with the present invention, the source/drain region is provided with a sheet resistance of 1.4 KΩ/□ to 20 KΩ/□. The lower limit is to prevent the TFT in an accelerated test from being depleted, and the upper limit is to ensure an ON current. A more preferred value of the sheet resistance of the source/drain region is 3 KΩ/□ to 10 KΩ/□.

Figure 20:
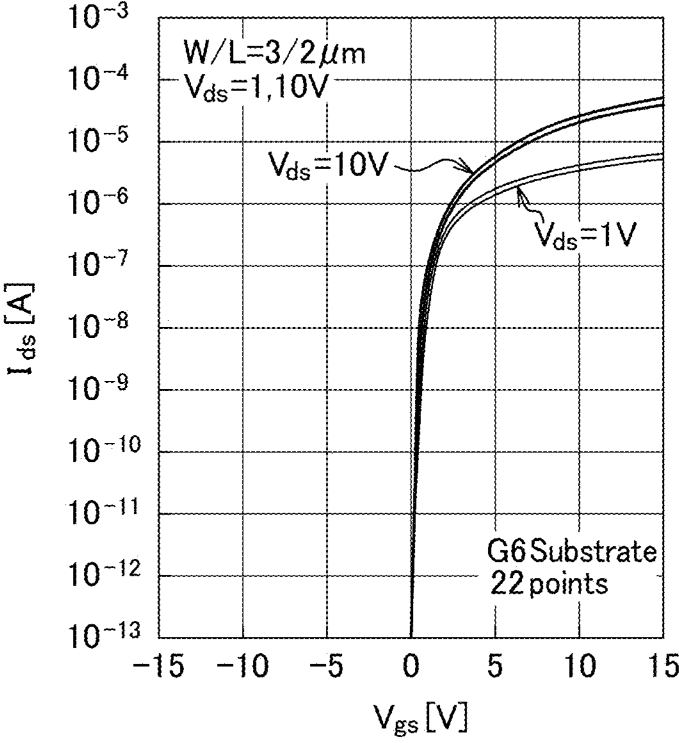
FIG. 20 is examples of characteristics of the oxide semiconductor TFT formed according to embodiment 1.

FIG. 20 shows an example of the Vgs–Ids characteristic of the TFT when the sheet resistance of the source/drain region is set to 1.4 KΩ/□ or 20 KΩ/□. Measurements are taken at 22 points on the G6 substrate. Each two lines in the Vds=10V, Vds=1V indicates that the Ids in each condition fall within this range. In FIG. 20, the horizontal axis represents Vgs (V), and the vertical axis represents Ids (A). The table at the bottom of FIG. 20 is the performance of the corresponding TFT. In the table, the field effect mobility μFE is 9.5 $cm^2$/Vs, Vth is 0.44 V when Ids is 1 nA, which are appropriate values as a normal TFT. The value of σVth is the variance of the thresh hold voltage of 22 pieces of samples. The value of σVth is maintained small as 0.26 V.

Figure 21:
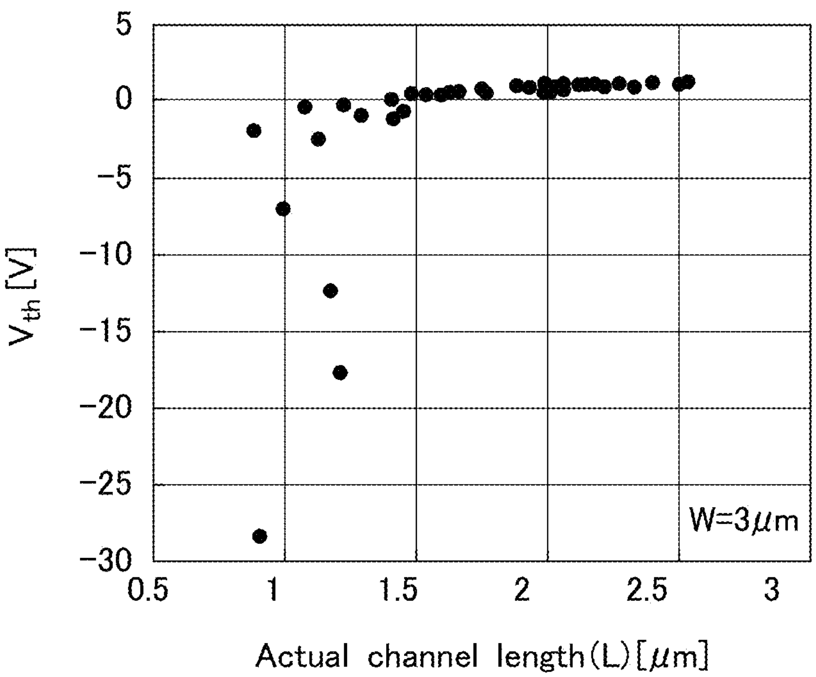
FIG. 21 is a graph which shows a relation between a length L of a channel and a thresh hold voltage Vth in the oxide semiconductor TFT formed according to embodiment 1.

FIG. 21 shows a test result of how small the gate electrode can be made, provided: the sheet resistance of the source/drain region is set 1.4 KΩ/□ to 20 KΩ/□, the channel width W of the TFT is set 3 μm. In FIG. 21, a horizontal axis represents a channel length L (μm), and a vertical axis represents a threshold voltage Vth (V). In FIG. 21, Actual channel length of the horizontal axis indicates a width of a gate electrode. As shown in FIG. 21, by using the configuration of this embodiment, the channel length can be reduced to 1.3 μm. On the other hand, when the channel length exceeds 3 μm, an oxide semiconductor TFT can be realized even when the configuration of this embodiment is not used. In other words, a channel length of 3 μm or less, particularly 2.3 μm or less, can remarkably exhibit the characteristics of the present invention.

Figure 22:
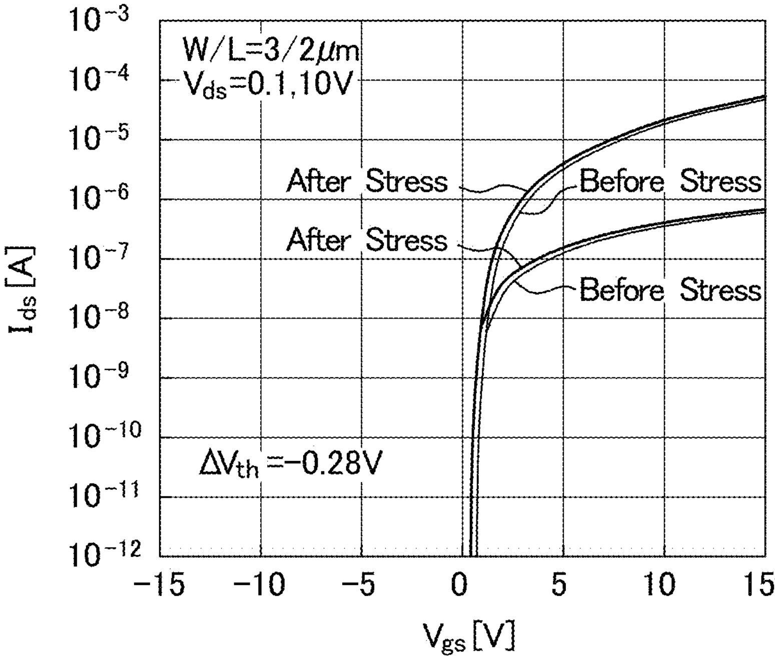
FIG. 22 is a graph which shows a result of an accelerated test for the oxide semiconductor TFT formed according to embodiment 1.

FIG. 22 is a graph showing how the characteristics of the TFT change in the NBTIS acceleration test when the sheet resistance of the source/drain region is a 1.4 KΩ/□ or a 20 KΩ/□. The condition of the NBTIS acceleration test in this case is as shown in the lower side of FIG. 22. In FIG. 22, the horizontal axis represents Vgs (V), and the vertical axis represents Ids (A). When the change in characteristics of the TFT before and after the acceleration test is represented by the change A Vth of the threshold voltage, the change A Vth is −0.28 V, which is a sufficiently small value.

As described above, if the sheet resistance of the source/drain region of the TFT is set to 1.4 KΩ/□ to 20 KΩ/□ by setting the ion implantation conditions and the conditions for forming the silicon nitride film in the interlayer insulating film, it is possible to ensure the necessary characteristics and reliability of the TFT even in a thin TFT having a channel length of 1.3 to 2.3 μm.

Note that, in the above-described embodiment, a so-called top-gate TFT in which an oxide semiconductor is provided between a substrate and a gate electrode is disclosed. However, the present invention is not limited to the top gate type TFT, but applied to a structure that a metal layer is formed at lower side (substrate side) and at upper side of the oxide semiconductor. In this case, the thickness of the insulating film between each metal layer and the oxide semiconductor is made different so that one of the metal layers has a major role as a gate electrode.

In addition, it is also possible to use the above-described metal layer instead of using the gate electrode as a mask in the ion implantation. For example, even in the case of a bottom-gate TFT, a metal layer may be provided at a portion corresponding to a channel, and ion implantation may be performed using the metal layer as a mask. Alternatively, ion implantation may be performed using a mask different from the metal layer.

Embodiment 2

Figure 23:
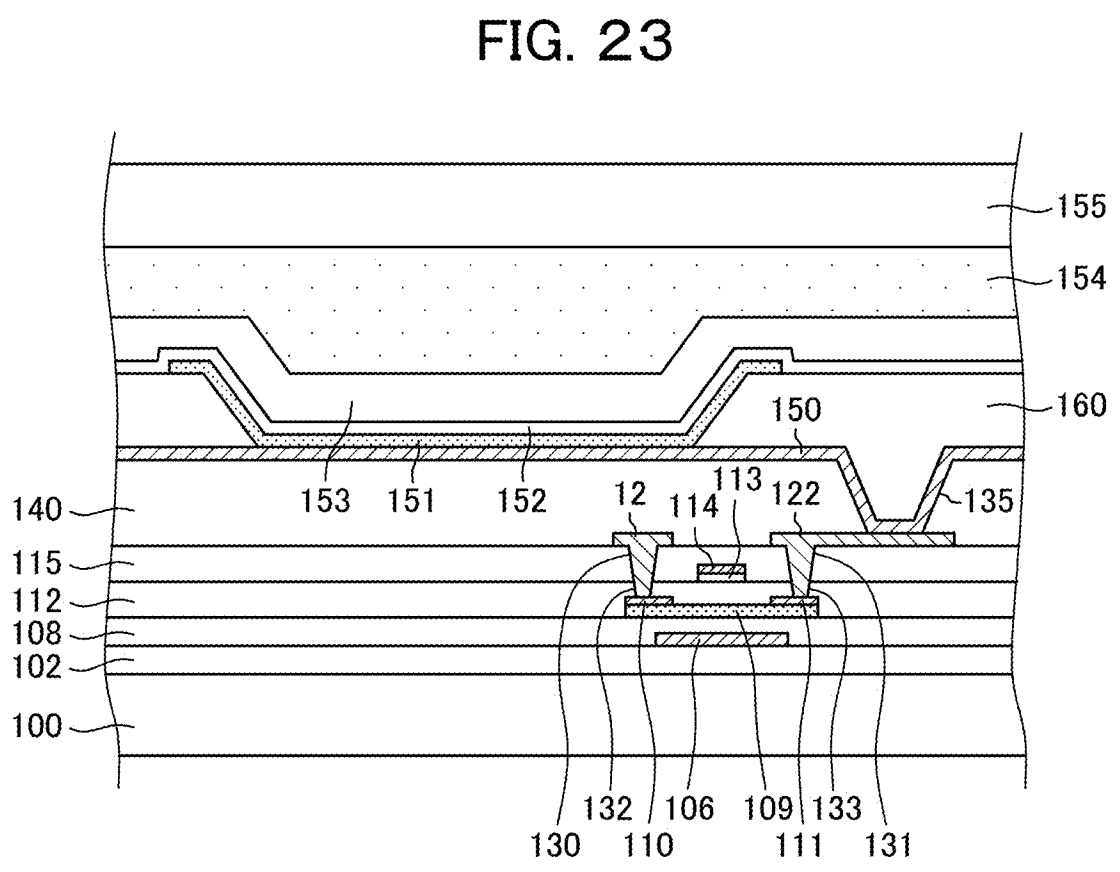

In Embodiment 1, the present invention has been described in terms of a liquid crystal display device. However, the present invention is applicable not only to a liquid crystal display device but also to an organic EL display device. FIG. 23 is a cross-sectional view of a display region of an organic EL display device. The configuration of FIG. 23 is the same as that of the liquid crystal display device shown in FIG. 2 until the oxide semiconductor TFT is formed and covered with an organic passivation film 140 to form a through hole 135 for conduction between the TFT and the lower electrode 150.

In FIG. 23, a lower electrode 150 as an anode is formed on an organic passivation film 140. A bank 160 having holes is formed on the lower electrode 150. An organic EL layer 151 as a light emitting layer is formed in a hole of a bank 160. An upper electrode 152 as a cathode is formed on the organic EL layer 151. The upper electrode 152 is formed in common to each pixel. A protective film 153 having a silicon nitride film or the like is formed covering the upper electrode 152. A circularly polarizing plate 155 for preventing reflection of external light is stuck on the protective film 153 via an adhesive 154.

As shown in FIG. 23, the oxide semiconductor TFT is formed in the same manner as the liquid crystal display device described in Embodiment 1. Accordingly, the present invention can be applied also to an organic EL display device.

Embodiment 3

The present invention is applicable to a semiconductor device such as a sensor device using an oxide semiconductor TFT as well as a display device. This is because an oxide semiconductor TFT as a sensor element or the like may be used as a switching element in each sensor element. Hereinafter, a case where the present invention is applied to a semiconductor device will be described for a sensor as an example.

Figure 24:
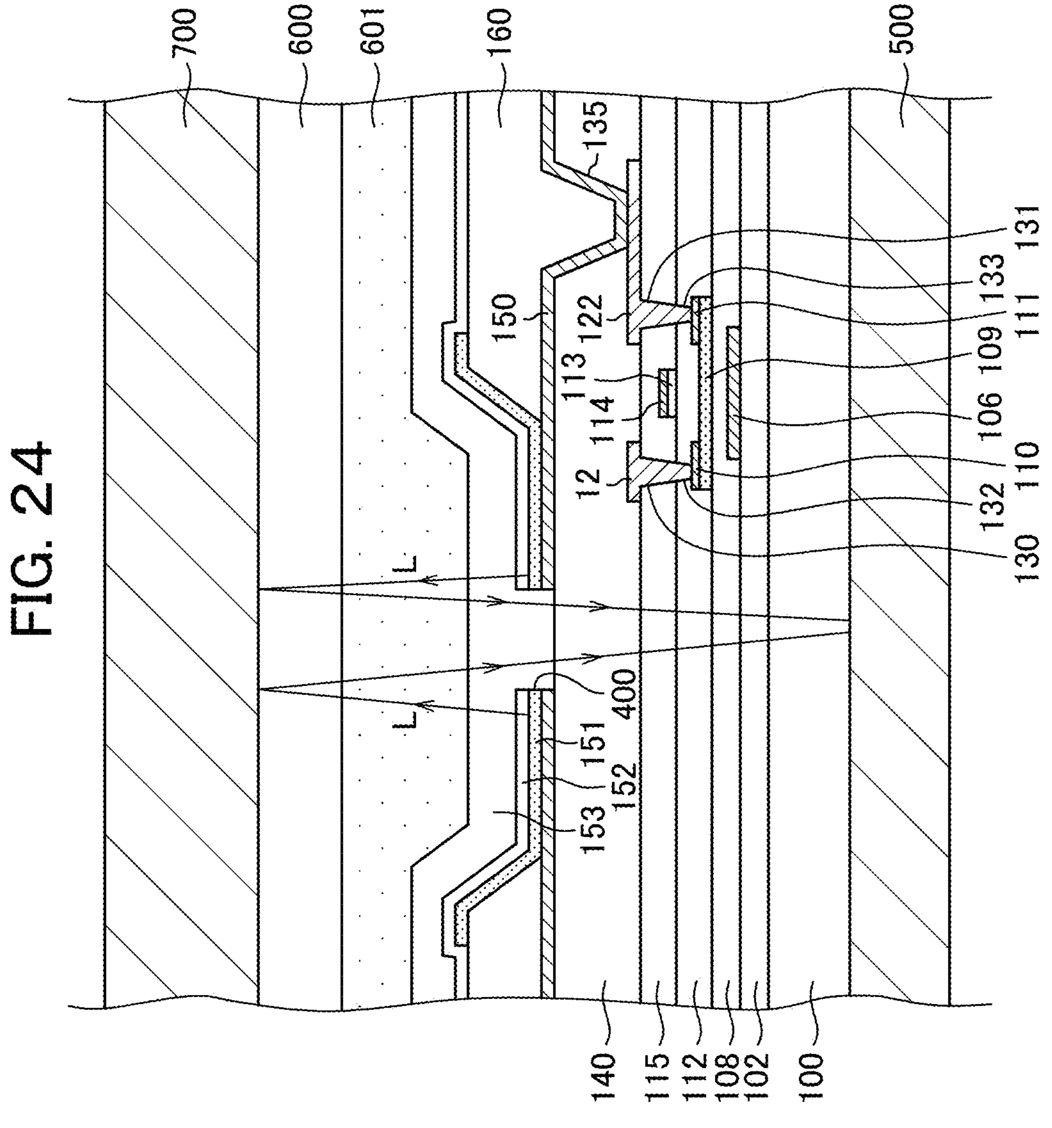
FIG. 24 is a cross sectional view of a censor area of a photo sensor device.

There are many types of sensors. FIG. 24 shows an example in which the same configuration as that of an organic EL display device is used as an optical sensor. In other words, an organic EL display device is used as a light-emitting element. In FIG. 24, in the display region of the organic EL display device described with reference to FIG. 23 (light emitting element), a light receiving element 500 is disposed on the lower surface of the TFT substrate 100. On an upper surface of the light emitting element, a face plate 600 formed of a transparent glass substrate or a transparent resin substrate is disposed via an adhesive material 601. The object 700 is placed on the face plate 600.

In a light-emitting element, a light-emitting region includes an organic EL layer 151, a lower electrode 150, and an upper electrode 152. A window 400 in which an organic EL layer, a lower electrode, and an upper electrode do not exist is formed in a central portion of a light emitting region, and a light can pass through this portion. Note that a reflection electrode is formed below the lower electrode 150, and light emitted from the organic EL layer 151 goes upward.

In FIG. 24, light emitted from an organic EL layer 151 is reflected by an object 700 to be measured, and is received by a light receiving element 500 arranged under a TFT substrate 100 through a window 400, and it is detected that an object 700 to be measured exists. When there is no object 700 to be measured, no reflected light is present, so that no current flows through the light receiving element 500. Therefore, a device can detect whether an object exists or not.

Figure 25:
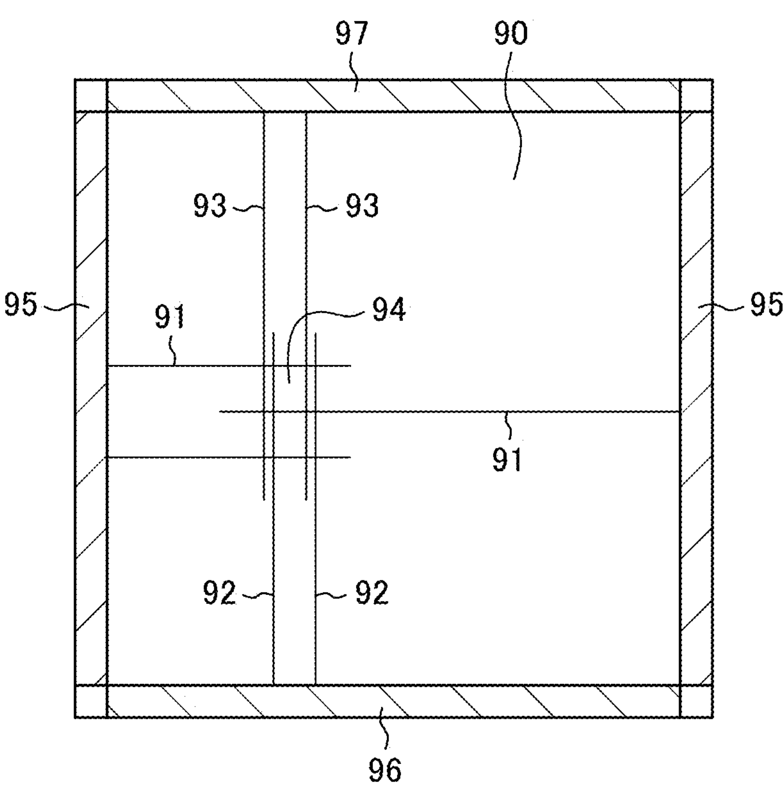
FIG. 25 is a plan view of a photo sensor device.
Figure 25:
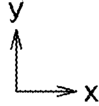

FIG. 25 is a plan view of a sensor (an optical sensor, a temperature sensor, a pressure sensor, a capacitance sensor, and the like) in which the sensor elements shown in FIG. 24 are arranged in a matrix. In FIG. 25, scanning lines 91 extend in the lateral direction (x-direction) from scanning circuits 95 arranged on both sides. A signal line 92 extends in the vertical direction (y direction) from the signal circuit 96 disposed on the lower side, and a power supply line 93 extends downward (−y direction) from the power supply circuit 97 disposed on the upper side. A region surrounded by the scanning line 91, the signal line 92, or the scanning line 91 and the power supply line 93 is a sensor element 94. A transistor for detection is connected to a sensor material made of an organic material or an inorganic material. It is possible to form the detection transistor with the TFT of the present invention. Note that in the organic EL display device shown in Embodiment 2, various transistors, such as a transistor for storing a video signal from a video signal line, a transistor for resetting a capacitance, and the like, other than the driving transistor, are provided in each pixel. In addition, a variety of transistors other than the detection transistor may be provided in the sensor element. It is also possible to apply the transistor of the present invention to each pixel or all of the transistors of the sensor element. In addition, it is also possible to use a transistor of the present invention for a part of transistors in the device as a driving transistor, detecting transistor and the like, and to use a transistor of silicon for another part of the transistors in the device. In addition, a transistors of oxide semiconductors, which do not adopt the ion implantation unlike the present invention, can be used for the another part of transistors in the device While FIG. 25 shows the scanning circuit 95 and the signal circuit 96 in the sensor, the scanning circuit 95 can be applied to the driving circuit of the scanning line of Embodiment 1 and the signal circuit 96 can also be applied to the driving circuit of the video signal line of Embodiment 1. Further, the power supply circuit 97 can be applied to a power supply circuit provided in the display device of Embodiment 1. In other words, it is possible to use a TFT in which the sheet resistance of the source/drain region of the TFT is 1.4 KΩ/□ to 20 KΩ/□. In the oxide semiconductor TFT according to the present invention, since the channel width can be increased and the channel length can be reduced, the driving current and the driving speed can be improved. Thus, it is also possible to form a drive circuit by adopting the TFT of the present invention.

Alternatively, a polysilicon TFT may be used as the driving circuit. In this case, since the manufacturing temperature of the polysilicon TFT is higher than the manufacturing temperature of the oxide semiconductor TFT, the polysilicon TFT is formed before the oxide semiconductor TFT. In other words, the polysilicon TFT is located closer to the TFT substrate than the oxide semiconductor TFT. The structure of the oxide semiconductor in this case is also the same as that described in Embodiment 1.

In addition, in the optical sensor of this embodiment, it is possible to read a two dimensional image by simply measuring not only the presence or absence of the object 700 but also the intensity of the reflection from the object 700. It is also possible to detect a color image or a spectral image by sensing each color. Although the resolution of the sensor depends on the size of the sensor element 94 in FIG. 25, it is possible to adjust the effective sensor element size by collectively driving the plurality of sensor elements 94 as needed.

In the example of FIGS. 24 and 25, an example in which the same configuration as that of an organic EL display device is applied to an optical sensor, but the present invention is applicable not only to such a configuration but also to an optical sensor using another detection method. In addition, a combination with an organic EL display device is not essential, and the present invention can be applied to a sensor alone. The present invention can be applied to a display device using a micro LED. In addition, in FIG. 2, the oxide semiconductor film 109 is connected to the video signal line 12 via the drain electrode 110 and is connected to the contact electrode 122 via the source electrode 111. However, the present invention is not necessary to limit in that structure; the video signal line can connect to the oxide semiconductor and the contact electrode 122 may be connected to the oxide semiconductor film via the contact hole 131. In this case, the video signal line serves as a drain electrode, and the contact electrode serves as a source electrode.

What is claimed is:

1. A thin film transistor comprising:

an oxide semiconductor, a gate electrode formed of a metal layer, and a gate insulating film formed between the oxide semiconductor and the gate electrode, wherein the oxide semiconductor has a channel region corresponding to the gate electrode, and a source region and a drain region adjacent to the channel region, a channel length of the channel region is 1.3 to 2.3 μm, a sheet resistance of the drain region and the source region is 1.4 KΩ/□ to 20 KΩ/□, the gate insulating film is a first silicon oxide film, and the drain region and the source region are covered with the gate insulating film and are in contact with the gate insulating film, a silicon nitride film is formed on the gate insulating film corresponding to the source region and the drain region, and a second silicon oxide film is formed on the silicon nitride film, each of the drain region and the source region has an oxygen-deficient portion formed by ions doped by ion implantation, and the amount of hydrogen supplied from the silicon nitride film to the oxide semiconductor is less than the amount of hydrogen that can be taken into the oxygen-deficient regions.

2. The thin film transistor according to claim 1, wherein the sheet resistance of the drain region and the source region is 3 KΩ/□to 10 KΩ/□.

3. The thin film transistor according to claim 1, wherein the hydrogen supplied from the silicon nitride film to the oxide semiconductor is taken into the oxygen-deficient portion and does not migrate to the channel region.

4. The thin film transistor according to claim 1, wherein the drain region and the source region are doped with boron (B) by ion implantation.

5. The thin film transistor according to claim 2, wherein the drain region and the source region are doped with boron (B) by ion implantation.

6. The thin film transistor according to claim 3, wherein the drain region and the source region are doped with boron (B) by ion implantation.

7. A semiconductor device comprising:

a substrate, an oxide semiconductor formed on the substrate, a first insulating film formed on the oxide semiconductor, a metal layer formed on the first insulating film a source electrode and a drain electrode electrically connected to the oxide semiconductor, and a second insulating film formed on the first insulating film and the metal layer, wherein the oxide semiconductor has a channel region corresponding to the metal layer, a source region adjacent to the channel region and electrically connected to the source electrode, and a drain region adjacent to the channel region and electrically connected to the drain electrode, a channel length of the channel region is 1.3 to 2.3 μm, a sheet resistance of the drain region and the source region is 1.4 KΩ/□to 20 KΩ/□, the first insulating film is a first silicon oxide film, and the drain region and the source region are covered with the first insulating film and are in contact with the first insulating film, the second insulating film includes a silicon nitride film formed on the first insulating film corresponding to the source region and the drain region, and a second silicon oxide film formed on the silicon nitride film, each of the drain region and the source region has an oxygen-deficient portion formed by ions doped by ion implantation, and the amount of hydrogen supplied from the silicon nitride film to the oxide semiconductor is less than the amount of hydrogen that can be taken into the oxygen-deficient regions.

8. The semiconductor device according to claim 7, wherein the hydrogen supplied from the silicon nitride film to the oxide semiconductor is taken into the oxygen-deficient portion and does not migrate to the channel region.

* * * * *